(12) United States Patent
Cho

(10) Patent No.: US 7,985,667 B2
(45) Date of Patent: Jul. 26, 2011

(54) METHOD FOR PATTERNING SEMICONDUCTOR DEVICE HAVING MAGNETIC TUNNELING JUNCTION STRUCTURE

(75) Inventor: Sang-Hoon Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/492,697

(22) Filed: Jun. 26, 2009

(65) Prior Publication Data

US 2010/0055804 A1 Mar. 4, 2010

(30) Foreign Application Priority Data

Sep. 2, 2008 (KR) .................. 10-2008-0086308

(51) Int. Cl.
*H01L 21/22* (2006.01)
*H01L 21/38* (2006.01)

(52) U.S. Cl. ............ 438/553; 438/3; 438/381; 438/257; 438/636; 257/E21.006; 257/E21.058; 257/E21.208; 257/E21.249; 257/E21.259; 257/E21.253; 257/E21.332

(58) Field of Classification Search ............... 438/3, 257, 438/381, 553, 622, 671, 684, 683, 636, 782, 438/769; 257/E21.006, 58, 208, 249, 359, 257/253, 332
See application file for complete search history.

(56) References Cited

U.S. PATENT DOCUMENTS

| | | | | |
|---|---|---|---|---|
| 6,921,953 | B2 * | 7/2005 | Deak | 257/421 |
| 7,381,573 | B2 * | 6/2008 | Deak | 438/3 |
| 7,411,262 | B2 * | 8/2008 | Deak | 257/421 |
| 2009/0159562 | A1 * | 6/2009 | Cho et al. | 216/22 |

FOREIGN PATENT DOCUMENTS

| | | |
|---|---|---|
| KR | 1020040060313 A | 7/2004 |
| KR | 100487927 B | 4/2005 |

OTHER PUBLICATIONS

Notice of Allowance issued from Korean Intellectual Property Office on Mar. 22, 2010.

* cited by examiner

*Primary Examiner* — David Nhu
(74) *Attorney, Agent, or Firm* — IP & T Group LLP

(57) ABSTRACT

A method for patterning a semiconductor device includes forming a lower electrode conductive layer over a substrate, forming a stack structure including a lower electrode conductive layer, a first ferromagnetic layer, an insulation layer and a second ferromagnetic layer over a substrate, forming an upper electrode conductive layer used as a first hard mask over the stack structure, forming a second hard mask layer over the upper electrode conductive layer, selectively etching the second hard mask layer to form a second hard mask pattern, etching the upper electrode conductive layer using the second hard mask pattern as an etch barrier to form an upper electrode, and etching the stack structure including the lower electrode conductive layer, the first ferromagnetic layer, the insulation layer and the second ferromagnetic layer by at least using the upper electrode as an etch barrier.

13 Claims, 5 Drawing Sheets

METHOD FOR PATTERNING SEMICONDUCTOR DEVICE HAVING MAGNETIC TUNNELING JUNCTION STRUCTURE

CROSS-REFERENCE TO RELATED APPLICATIONS

The present application claims priority of Korean patent application number 10-2008-0086308, filed on Sep. 2, 2008, the disclosure of which is incorporated by reference in its entirety.

BACKGROUND OF THE INVENTION

The present invention relates to a method for fabricating a semiconductor device, and more particularly, to a method for patterning a semiconductor device having a magnetic tunneling junction (MTJ) structure.

Recently, researches have been conducted with respect to next-generation memory devices that can replace dynamic random access memory (DRAM) and flash memory device. For example, one of next-generation memory devices is spin transfer torque random access memory (STT-RAM). The STT-RAM stores different data, which is bit data '0' or '1,' based on whether the magnetic tunneling junction structure is magnetized or not. More specifically, the magnetic tunneling junction structure is formed of a sandwich structure including two ferromagnetic layers and an insulation layer. Generally, the insulation layer may be embodied as $Al_2O_3$. The insulation layer functions as a tunneling barrier disposed between the two ferromagnetic layers.

FIGS. 1A and 1B are cross-sectional views illustrating a conventional method for fabricating a semiconductor device having a magnetic tunneling junction structure.

As shown in FIG. 1A, a lower electrode conductive layer 11 is formed over a substrate 10 with a predetermined lower structure formed therein.

A first ferromagnetic layer 12 is formed over the lower electrode conductive layer 11. An insulation layer 13 as a tunneling barrier is formed over the first ferromagnetic layer 12. A second ferromagnetic layer 14 is formed over the insulation layer 13. Thus, a magnetic tunneling junction structure is formed over the lower electrode conductive layer 11.

An upper electrode conductive layer 15 is formed over the second ferromagnetic layer 14. The upper electrode conductive layer 15 is used as a hard mask for subsequent patterning of the lower layers, i.e., the second ferromagnetic layer 14, the insulation layer 13, the first ferromagnetic layer 12 and the lower electrode conductive layer 11.

A photoresist pattern 17 is formed over the upper electrode conductive layer 15 to pattern the upper electrode conductive layer 15, the second ferromagnetic layer 14, the insulation layer 13, the first ferromagnetic layer 12 and the lower electrode conductive layer 11. Herein, before forming the photoresist pattern 17, an anti-reflection layer 16 may be formed over the upper electrode conductive layer 15 to prevent reflection during a lithography process.

As shown in FIG. 1B, an upper electrode 15A is formed by etching the upper electrode conductive layer 15 using the photoresist pattern 17 as an etch barrier. In this etching process, the photoresist pattern 17 may be damaged.

The second ferromagnetic layer 14, the insulation layer 13, the first ferromagnetic layer 12 and the lower electrode conductive layer 11 are sequentially etched using at least the upper electrode 15A as an etch barrier, to form a second ferromagnetic pattern 14A, an insulation pattern 13A, a first ferromagnetic pattern 12A and a lower electrode 11A, respectively. Thus, a magnetic tunneling junction structure 100 including the first ferromagnetic pattern 12A, the insulation pattern 13A and the second ferromagnetic pattern 14A sequentially disposed between the lower electrode 11A and the upper electrode 15A is formed.

Since the size of a memory device having the magnetic tunneling junction is comparatively small, a lithography equipment such as ArF is required to form the photoresist pattern 17. Also, the height of the photoresist pattern 17 is restricted to be within low limits. Thus, the upper electrode 15A may be damaged due to margin deficiency of the photoresist pattern 17, and the second ferromagnetic pattern 14A under the upper electrode 15A may be damaged.

SUMMARY OF THE INVENTION

Embodiments of the present invention are directed to provide a method for patterning a semiconductor device having a magnetic tunneling junction structure that can prevent attack of lower layers due to margin deficiency of a photoresist pattern by using a double hard mask.

In accordance with an aspect of the present invention, there is provided a method for patterning a semiconductor device, including: forming a stack structure including a lower electrode conductive layer, a first ferromagnetic layer, an insulation layer and a second ferromagnetic layer over a substrate; forming an upper electrode conductive layer used as a first hard mask over the stack structure; forming a second hard mask layer over the upper electrode conductive layer; selectively etching the second hard mask layer to form a second hard mask pattern; etching the upper electrode conductive layer using the second hard mask pattern as an etch barrier to form an upper electrode; and etching the stack structure including the lower electrode conductive layer, the first ferromagnetic layer, the insulation layer and the second ferromagnetic layer by at least using the upper electrode as an etch barrier.

In accordance with another aspect of the present invention, there is provided a method for patterning a semiconductor device, including: forming an upper electrode conductive layer used as a first hard mask over a stack structure including a first ferromagnetic layer, a second ferromagnetic layer, and an insulation layer formed between the first ferromagnetic layer and the second ferromagnetic layer; forming a second hard mask layer over the upper electrode conductive layer; selectively etching the second hard mask layer to form a hard mask pattern; and etching the upper electrode conductive layer to form an upper electrode by using the etched hard mask pattern.

DESCRIPTION OF SPECIFIC EMBODIMENTS

Figure 1A:
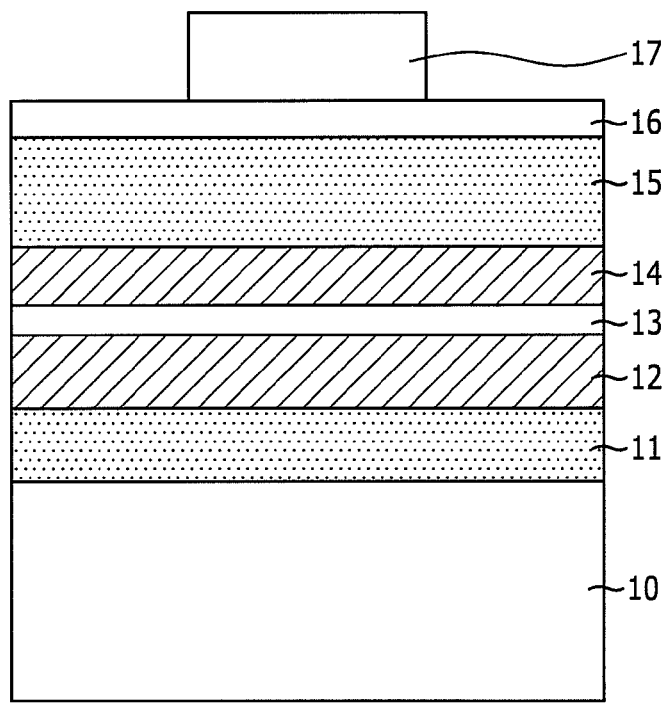
FIGS. 1A and 1B are cross-sectional views illustrating a conventional method for fabricating a semiconductor device having a magnetic tunneling junction structure.
Figure 1B:
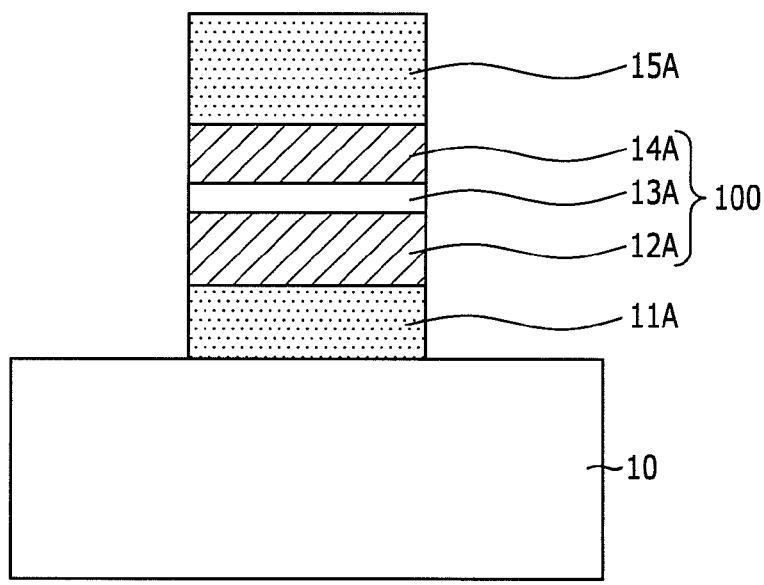

Other objects and advantages of the present invention can be understood by the following description, and become apparent with reference to the embodiments of the present invention.

In the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

FIGS. 2A to 2D are cross-sectional views illustrating a method for patterning a semiconductor device having a magnetic tunneling junction structure in accordance with a first embodiment of the present invention.

Figure 2A:
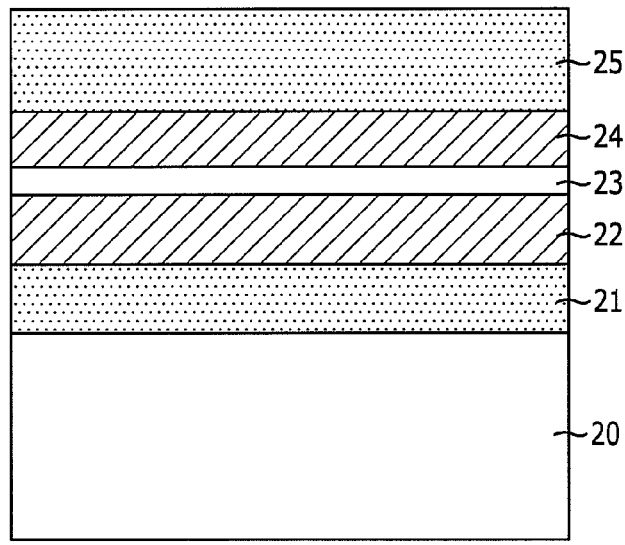
FIGS. 2A to 2D are cross-sectional views illustrating a method for patterning a semiconductor device having a magnetic tunneling junction structure in accordance with a first embodiment of the present invention.

As shown in FIG. 2A, a lower electrode conductive layer 21 is formed over a substrate 20 with a predetermined lower structure formed therein. The lower electrode conductive layer 21 may be formed of tantalum (Ta).

A first ferromagnetic layer 22 is formed over the lower electrode conductive layer 21. An insulation layer 23 as a tunneling barrier is formed over the first ferromagnetic layer 22. A second ferromagnetic layer 24 is formed over the insulation layer 23. Thus, a magnetic tunneling junction structure is formed over the lower electrode conductive layer 21.

An upper electrode conductive layer 25 is formed over the second ferromagnetic layer 24. The upper electrode conductive layer 25 is used as a hard mask for subsequent patterning of the lower layers, i.e., the second ferromagnetic layer 24, the insulation layer 23, the first ferromagnetic layer 22 and the lower electrode conductive layer 21. The upper electrode conductive layer 25 may be formed of tantalum (Ta).

Figure 2B:
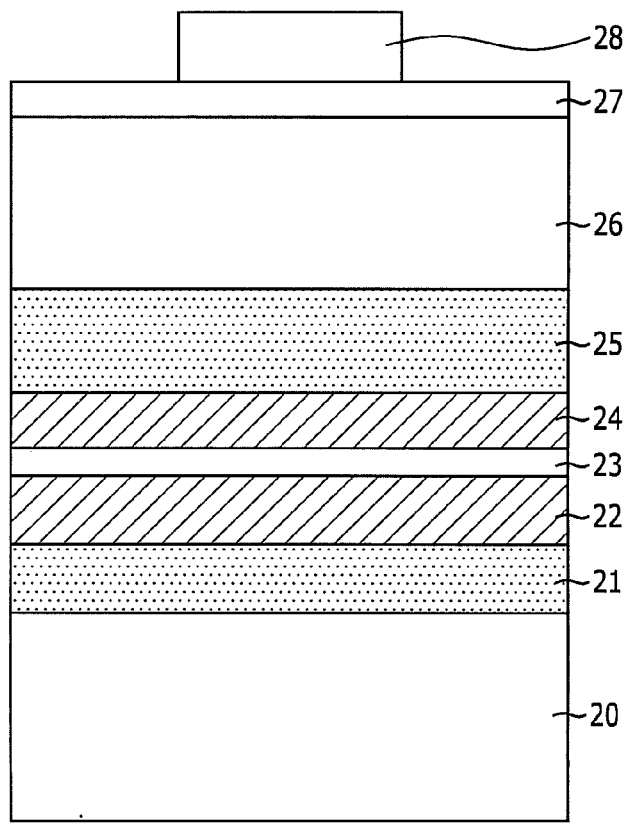

As shown in FIG. 2B, a hard mask 26 is additionally formed over the upper electrode conductive layer 25 as a hard mask before the photoresist pattern is formed. The reason for forming an additional hard mask 26 in addition to the upper electrode conductive layer 25 is to resolve the difficulty of etching the upper electrode conductive layer 25 due to the margin deficiency of the photoresist pattern. The upper electrode conductive layer 25 is used as a first hard mask, and the hard mask 26 is used as a second hard mask. That is, the present invention uses double hard mask. The hard mask 26 may be formed of an oxide-based layer or a polysilicon layer. For example, the oxide-based layer may be a plasma enhanced tetra ethyl ortho silicate (PETEOS) layer, a high density plasma (HDP) layer, a phosphor silicate glass (PSG) layer, a $SiO_2$ layer or an undoped silicate glass (USG) layer.

A photoresist pattern 28 is formed over the hard mask 26 to pattern the upper electrode conductive layer 25, the second ferromagnetic layer 24, the insulation layer 23, the first ferromagnetic layer 22 and the lower electrode conductive layer 21. Before forming the photoresist pattern 28, an anti-reflection layer 27 may be formed over the hard mask 26 to prevent reflection during a lithography process.

Figure 2C:
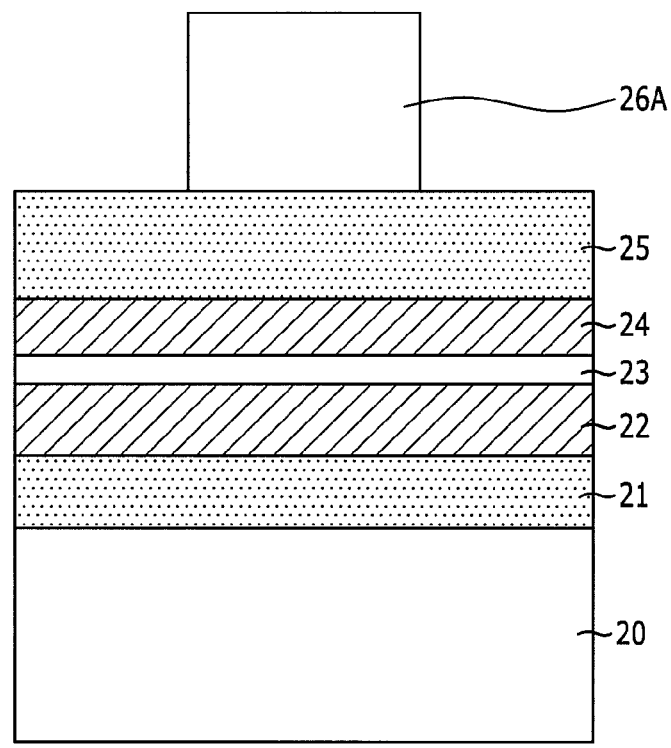

As shown in FIG. 2C, a hard mask pattern 26A is formed from etching the hard mask 26 by using the photoresist pattern 28 as an etch barrier.

The photoresist pattern 28 may be removed during the formation process of the hard mask pattern 26A or a separate strip process.

Figure 2D:
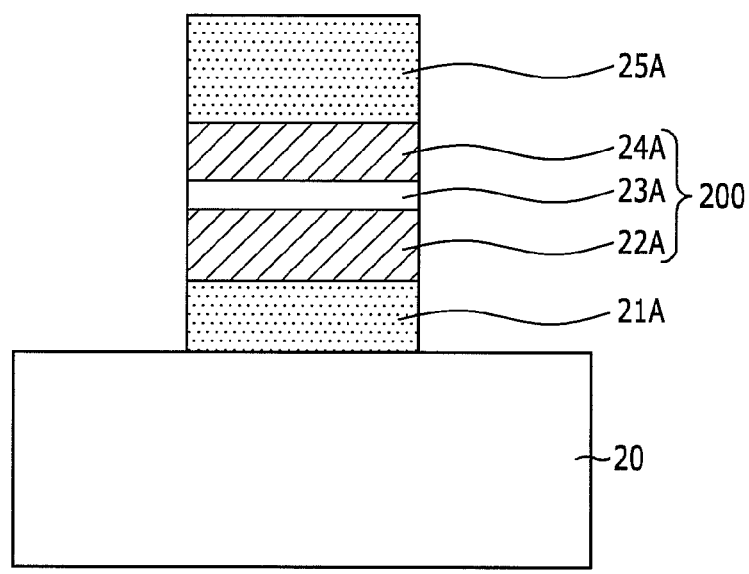

As shown in FIG. 2D, an upper electrode 25A is formed by etching the upper electrode conductive layer 25 using the hard mask pattern 26A as an etch barrier.

The second ferromagnetic layer 24, the insulation layer 23, the first ferromagnetic layer 22 and the lower electrode conductive layer 21 are sequentially etched using at least the upper electrode 25A as an etch barrier, to form a second ferromagnetic pattern 24A, an insulation pattern 23A, a first ferromagnetic pattern 22A and a lower electrode 21A, respectively. Thus, a magnetic tunneling junction structure 200 is formed. The magnetic tunneling junction structure 200 includes the first ferromagnetic pattern 22A, the insulation pattern 23A and the second ferromagnetic pattern 24A sequentially disposed between the lower electrode 21A and the upper electrode 25A.

As described above, since the hard mask pattern 26A and the upper electrode 25A act as double hard mask, patterning of the magnetic tunneling junction structure 200 and the lower electrode 21A is easy.

FIGS. 3A to 3D are cross-sectional views illustrating a method for patterning a semiconductor device having a magnetic tunneling junction structure in accordance with a second embodiment of the present invention.

Figure 3A:
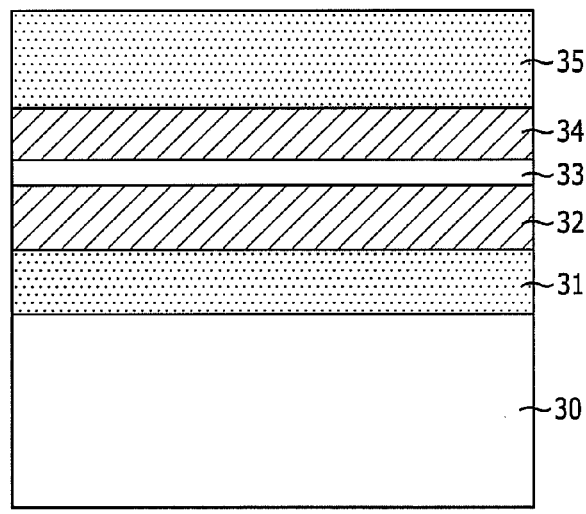
FIGS. 3A to 3D are cross-sectional views illustrating a method for patterning a semiconductor device having a magnetic tunneling junction structure in accordance with a second embodiment of the present invention.

As shown in FIG. 3A, a lower electrode conductive layer 31 is formed over a substrate 30 with a predetermined lower structure formed therein. The lower electrode conductive layer 31 may be formed of Ta.

A first ferromagnetic layer 32 is formed over the lower electrode conductive layer 31. An insulation layer 33 as a tunneling barrier is formed over the first ferromagnetic layer 32. A second ferromagnetic layer 34 is formed over the insulation layer 33. Thus, a magnetic tunneling junction structure is formed over the lower electrode conductive layer 31.

An upper electrode conductive layer 35 is formed over the second ferromagnetic layer 34. The upper electrode conductive layer 35 is used as a hard mask for subsequent patterning of the lower layers, i.e., the second ferromagnetic layer 34, the insulation layer 33, the first ferromagnetic layer 32 and the lower electrode conductive layer 31. The upper electrode conductive layer 35 may be formed of tantalum (Ta).

Figure 3B:
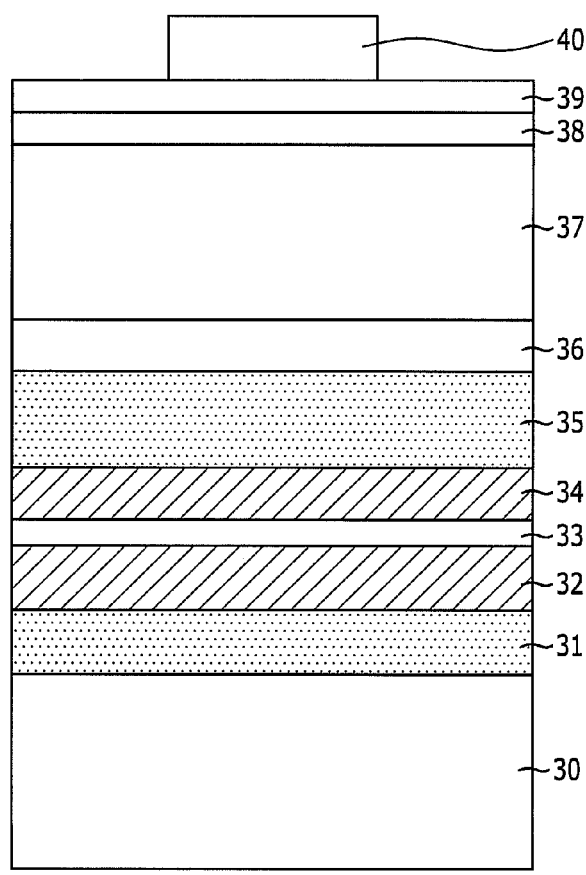

As shown in FIG. 3B, a hard mask 37 is additionally formed over the upper electrode conductive layer 35 before the photoresist pattern is formed. The reason for forming an additional hard mask 37 in addition to the upper electrode conductive layer 35 is to resolve the difficulty of etching the upper electrode conductive layer 35 due to the margin deficiency of the photoresist pattern. The upper electrode conductive layer 35 is used as a first hard mask, and the hard mask 37 is used as a second hard mask. That is, the present invention uses double hard mask. Herein, the hard mask 37 may be formed of carbon-based layer that is widely used as a hard mask due to relatively superior characteristics such as a secure of etch selectivity in the recent DRAM device. The carbon-based layer may be an amorphous carbon layer, a spin on carbon (SOC) layer or a SiOC layer.

Generally, Ta of the upper electrode conductive layer 35 has a bad adhesive property with respect to the carbon-based layer. Thus, in case where the hard mask 37 is formed of the carbon-based layer over the upper electrode conductive layer 35, there may be a problem in lifting the carbon-based layer. In order to resolve the above problem, a buffer layer 36 is disposed between the hard mask 37 formed of the carbon-based layer and the upper electrode layer 35. The buffer layer is formed of the oxide-based layer. For example, the oxide-based layer may be a plasma enhanced tetra ethyl ortho silicate (PETEOS) layer, a high density plasma (HDP) layer, a phosphor silicate glass (PSG) layer, a SiO₂ layer or an undoped silicate glass (USG) layer.

A photoresist pattern 40 is formed over the hard mask 37 to pattern the upper electrode conductive layer 35, the second ferromagnetic layer 34, the insulation layer 33, the first ferromagnetic layer 32 and the lower electrode conductive layer 31. Herein, before forming the photoresist pattern 40, SiON layer 38 and an anti-reflection layer 39 preventing reflection during a lithography process may be formed over the hard mask 37.

Figure 3C:
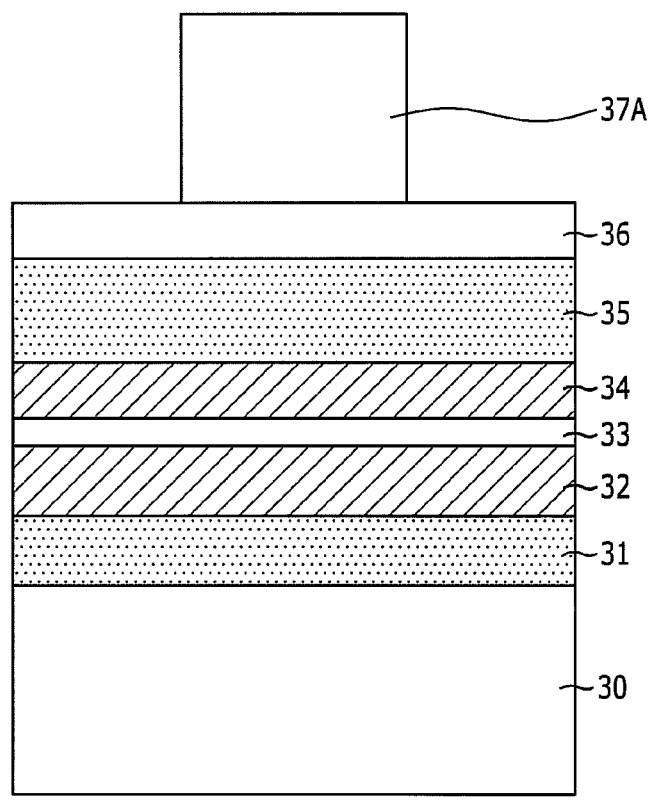

As shown in FIG. 3C, a hard mask pattern 37A is formed by etching the hard mask 37 using the photoresist pattern 40 as an etch barrier.

The photoresist pattern 40 may be removed during the formation process of the hard mask pattern 37A or during a separate strip process.

Figure 3D:
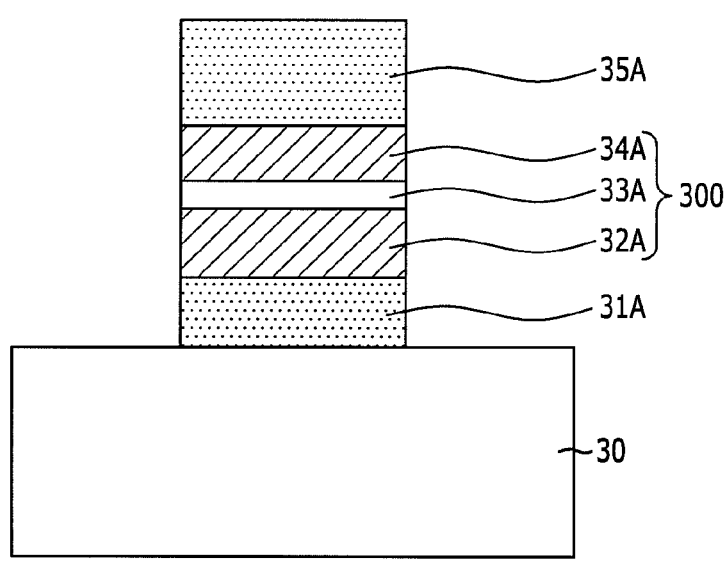

As shown in FIG. 3D, an upper electrode 35A is formed by etching the upper electrode conductive layer 35 using the hard mask pattern 37A as an etch barrier.

The second ferromagnetic layer 34, the insulation layer 33, the first ferromagnetic layer 32 and the lower electrode conductive layer 31 are sequentially etched using at least the upper electrode 35A as an etch barrier, to form a second ferromagnetic pattern 34A, an insulation pattern 33A, a first ferromagnetic pattern 32A and a lower electrode 31A, respectively. Thus, a magnetic tunneling junction structure 300 is formed. The magnetic tunneling junction structure 300 includes the first ferromagnetic pattern 32A, the insulation pattern 33A and the second ferromagnetic pattern 34A sequentially disposed between the lower electrode 31A and the upper electrode 35A.

As described above, the method for patterning a semiconductor device having a magnetic tunneling junction structure according to the present invention can prevent damage of lower layers due to margin deficiency of a photoresist pattern by using a double hard mask.

While the present invention has been described with respect to the specific embodiments, it will be apparent to those skilled in the art that various changes and modifications may be made without departing from the spirit and scope of the invention as defined in the following claims.

What is claimed is:

1. A method for patterning a semiconductor device, comprising:
    forming a stack structure including a lower electrode conductive layer, a first ferromagnetic layer, an insulation layer and a second ferromagnetic layer over a substrate;
    forming an upper electrode conductive layer used as a first hard mask over the stack structure;
    forming a second hard mask layer over the upper electrode conductive layer;
    selectively etching the second hard mask layer to form a second hard mask pattern;
    etching the upper electrode conductive layer using the second hard mask pattern as an etch barrier to form an upper electrode;
    etching the stack structure including the lower electrode conductive layer, the first ferromagnetic layer, the insulation layer and the second ferromagnetic layer by at least using the upper electrode as an etch barrier; and
    disposing a buffer layer between the upper electrode conductive layer and the second hard mask before forming of the second hard mask layer.

2. The method for patterning the semiconductor device according to claim 1, wherein the upper electrode conductive layer comprises a tantalum (Ta).

3. The method for patterning the semiconductor device according to claim 1, wherein the lower electrode conductive layer comprises a tantalum (Ta).

4. The method for patterning the semiconductor device according to claim 1, wherein the second hard mask includes a carbon-based layer.

5. The method for patterning the semiconductor device according to claim 4, wherein the carbon-based layer comprises an amorphous carbon layer, a spin on carbon (SOC) layer and a SiOC layer.

6. The method for patterning the semiconductor device according to claim 1, wherein the buffer layer comprises an oxide-based layer.

7. The method for patterning the semiconductor device according to claim 6, wherein the oxide-based layer comprises a plasma enhanced tetra ethyl ortho silicate (PETEOS) layer, a high density plasma (HDP) layer, a phosphor silicate glass (PSG) layer, a SiO₂ layer and an undoped silicate glass (USG) layer.

8. A method for patterning a semiconductor device, comprising:
    forming an upper electrode conductive layer used as a first hard mask over a stack structure including a first ferromagnetic layer, a second ferromagnetic layer, and an insulation layer formed between the first ferromagnetic layer and the second ferromagnetic layer;
    forming a second hard mask layer over the upper electrode conductive layer;
    selectively etching the second hard mask layer to form a hard mask pattern;
    etching the upper electrode conductive layer to form an upper electrode by using the etched hard mask pattern; and
    disposing a buffer layer between the upper electrode conductive layer and the second hard mask before forming of the second hard mask layer.

9. The method for patterning the semiconductor device according to claim 8, wherein the upper electrode conductive layer comprises a tantalum (Ta).

10. The method for patterning the semiconductor device according to claim 8, wherein the stack structure comprises a lower electrode conductive layer formed between the first ferromagnetic layer and a substrate and the lower electrode conductive layer comprises a tantalum (Ta).

11. The method for patterning the semiconductor device according to claim 8, wherein the second hard mask includes a carbon-based layer, and the carbon-based layer comprises an amorphous carbon layer, a spin on carbon (SOC) layer and a SiOC layer.

12. The method for patterning the semiconductor device according to claim 8, wherein the buffer layer comprises an oxide-based layer.

13. The method for patterning the semiconductor device according to claim 12, wherein the oxide-based layer comprises a plasma enhanced tetra ethyl ortho silicate (PETEOS) layer, a high density plasma (HDP) layer, a phosphor silicate glass (PSG) layer, a SiO₂ layer and an undoped silicate glass (USG) layer.

* * * * *